United States Patent
Garg et al.

(10) Patent No.: US 8,197,914 B2
(45) Date of Patent: Jun. 12, 2012

(54) METHOD FOR DEPOSITING ZINC OXIDE AT LOW TEMPERATURES AND PRODUCTS FORMED THEREBY

(75) Inventors: Diwakar Garg, Emmaus, PA (US); Philip Bruce Henderson, Allentown, PA (US); Daniel Joseph Tempel, Macungie, PA (US); Thomas N. Jackson, State College, PA (US); Jie Sun, State College, PA (US)

(73) Assignee: Air Products and Chemicals, Inc., Allentown, PA (US)

(*) Notice: Subject to any disclaimer, the term of this patent is extended or adjusted under 35 U.S.C. 154(b) by 640 days.

(21) Appl. No.: 11/284,193

(22) Filed: Nov. 21, 2005

(65) Prior Publication Data

US 2007/0116986 A1 May 24, 2007

(51) Int. Cl.
*H05H 1/24* (2006.01)
(52) U.S. Cl. ............ 427/576; 427/569; 427/248.1; 427/255.31; 427/69; 427/109
(58) Field of Classification Search ........... 427/569, 427/255.31, 255.33, 255.23, 255.28
See application file for complete search history.

(56) References Cited

U.S. PATENT DOCUMENTS

| | | | |
|---|---|---|---|
| 4,638,111 A | | 1/1987 | Gay |
| 4,751,149 A | * | 6/1988 | Vijayakumar et al. ......... 428/702 |
| 4,990,286 A | * | 2/1991 | Gordon ..................... 252/519.14 |
| 5,002,796 A | | 3/1991 | Nishida |
| 5,385,751 A | * | 1/1995 | Riaz et al. .................. 427/126.2 |
| 5,545,443 A | * | 8/1996 | Yamada et al. ................ 427/584 |
| 6,071,561 A | | 6/2000 | Gordon et al. |
| 6,458,673 B1 | * | 10/2002 | Cheung ..................... 438/479 |
| 2003/0146433 A1 | * | 8/2003 | Cantwell et al. ............... 257/43 |

FOREIGN PATENT DOCUMENTS

| | | |
|---|---|---|
| DE | 42 07 783 A1 | 9/1992 |
| EP | 0 204 563 A2 | 12/1986 |
| EP | 0 204 567 A2 | 12/1986 |
| JP | 62-7123 A | 1/1987 |
| JP | 62-008578 A | 1/1987 |
| JP | 4-280975 A | 10/1992 |
| JP | 2000-303175 | * 10/2000 |

(Continued)

OTHER PUBLICATIONS

B.S. Li, et al. "Groeth of high quality ZnO thin films at low temperatures on Si(100) substrate by plasma enhanced chemical vapor depositon" J. Vac. Sci. Technol. A 20(1) Jan. 2002; pp. 265-269.*

(Continued)

*Primary Examiner* — David Turocy
(74) *Attorney, Agent, or Firm* — Michael K. Boyer (57) ABSTRACT

The present invention discloses plasma enhanced chemical vapor deposition (PECVD) process for depositing n-type and p-type zinc oxide-based transparent conducting oxides (TCOs) at low temperatures with excellent optical and electrical properties on glass and temperature sensitive materials such as plastics and polymers. Specifically, it discloses PECVD process for depositing n-type ZnO by doping it with B or F and p-type ZnO by doping it with nitrogen excellent optical and electrical properties on glass and temperature sensitive materials such as plastics and polymers for TCO application. The process utilizes a mixture of volatile zinc compound, argon and/or helium as a diluent gas, carbon dioxide as an oxidant, and a dopant or reactant to deposit the desired ZnO-based TCOs.

25 Claims, 1 Drawing Sheet

FOREIGN PATENT DOCUMENTS

| JP | 2000-303175 A | 10/2000 |
|---|---|---|
| WO | WO 03/021690 A2 | 3/2003 |

OTHER PUBLICATIONS

Haga K, et al; ZnO Thin Films Prepared by Remote Plasma-Enhanced CVD Method; Journal of Crystal Growth, Elsevier, Amsterdam, NL; vol. 214-215; Jun. 2000; pp. 77-80; XP004200968.*
Kondo et al. Transparent Conductive ZnO Thin Films Prepared by Plasma Enhanced CVD-Effect of Boron Dopant. Kagaku Kogaku Ronbunshu. vol. 26;No. 2;p. 309-311(2000).*
Noltes, J. G.; "Zinc Chemicals" M. Farnsworth and C. H. Kline, Editors; Zinc Institute Inc., New York (1973) pp. 212-214.
Chi Kwan Lou et al; "Growth of Epitaxial ZnO Thin Films by Organometallic Chemical Vapor Deposition"; J. Electrochem. Soc.: Aug. 1980; 1843-1847I vol. 127, No. 8; Univ. of Southern Calif.
James R. Shealy, et al; "Preparation and Properties of Zinc Oxide Films Grown by the Oxidation of Diethylzinc"; Journal of the Electrochemical Society, vol. 128, No. 3; Mar. 1981; pp. 558-561.
A.P. Roth et al; "Properties of Zinc Oxide Films prepared by the oxidation of diethyl zinc"; J. Appl. Phys 52 (11), Nov. 1981; pp. 6685-6692.
Masaru Shimizu; "Preparation of ZnO Thin Films by Plasma-Enhanced Organometallic Chemical Vapour Deposition"; Presented at the International Conference on Metallurgical Coatings and Process Technology, San Diego; Apr. 5-8, 1982; pp. 149-154.
Frank T. J. Smith; "Metalorganic chemical vapor deposition of oriented Zno films over large areas"; 1983 American Institute of Physics; vol. 43, No. 12; Dec. 15, 1983; pp. 1108-1110.
R. Solanki et al;"Laser induced deposition of zinc oxide"; Appl. Phys. Letter 42(8); American Institute of Physics; Apr. 15, 1983; pp. 662-663.
S Major et al; Indium-Doped Zinc Oxide Films as Transparent Electrodes for Solar Cells; Solar Energy Materials 17 (1988), North Holland, Amsterdam; Feb. 16, 1988; pp. 319-327.
Wilson W. Wenas, "Textured ZnO Thin Films for Solar Cells Grown by Metalorganic Chemical Vapor Deposition"; Japanese Journal of Allied Physics; vol. 30, No. 3B, Mar. 1991, pp. L441-L443.
Akira Yamada, et al; Mobility Enhancement of Textured ZnO Films by Ultraviolet Light Irradiation; Japanese Journal of Applied Physics, vol. 30, No. 7A, Jul. 1991, pp. L1152-L1154.
Jianhua Hu et al; Textured fluorine-doped ZnO films by atmospheric pressure chemical vapor deposition and their use in amorphous silicon solar cells; Solar Cells, 30 (1991) pp. 437-450; Elsevier Sequoia/ printed in The Netherlands.
Wilson W. Wenas, et al; Electrical and optical properties of boron-doped ZnO thin films for solar cells grown by metalorganic chemical vapor deposition; J. Appl. Phys. 70 (11), Dec. 1, 1991; pp. 7119-7123.
Jianhua Hu et al; "Chemical Vapor Deposition of Highly Transparent and Conductive Boron Doped Zinc Oxide Thin Films"; Mat. Res. Soc. Symp. Proc., vol. 242; 1992 Materials research Society; pp. 743-748.
Jianhua Hu et al; Deposition of Highly Transparent and Conductive Fluorine Doped Zinc Oxide Films; Mat. Res. Soc. Symp. Proc. vol. 202; 1991 Materials Research Society; pp. 457-462.
Jianhua Hu et al; Electrical and Optical Properties of Doped Tin and Zinc Oxide Thin Films by Atmospheric Pressure Chemical Vapor Deposition; American Institute of Physics, 1992; pp. 381-387.
Jianhua Hu et al;"Textured aluminum-doped zinc oxide thin films from atmospheric pressure chemical-vapor deposition"; J. Appl. Phys. 71 (2), Jan. 15, 1992; pp. 880-890.
Jianhua Hu et al.; "Deposition of Boron Doped Zinc Oxide Films and Their Electrical and Optical Properties"; J. Electrochem. Soc., vol. 139, No. 7, Jul. 1992 pp. 2014-2022.
Jianhua Hu et al; "Atmospheric pressure chemical vapor deposition of gallium doped zinc oxide thin films from diethyl zinc, water, and triethyl gallium"; J. Appl. Phys. 72 (11), Dec. 1, 1992; pp. 5381-5392.
Jianhua Hu et al; "Electrical and Optical Properties of Indium Doped Zinc Oxide Films Prepared by Atmospheric Pressure Chemical Vapor Deposition"; Mat. Res. Soc. Symp. Proc. vol. 283; 1993 Materials Research Society; pp. 891-896.
Wilson W. Wenas et al; "Optimization of ZnO for front and rear contacts in a-Si solar cells"; Solar Energy Materials and Solar Cells 34 (1994) pp. 313-319.
Wilson W. Wenas et al; "Metalorganic Chemical Vapor Deposition of ZnO Using $D_2O$ as Oxidant"; Jpn. J. Appl, Phys. vol. 33 (1994) pp. L283-L285.
Steven Hegedus et al; Transparent Conducting Oxides (TCO's) for Amorphous Silicon Solar Cells; 1996 American Institute of Physics; pp. 465-472.
M. N. Islam; Preparation of Aluminium Doped Zinc Oxide Thin Films for the Transparent Conducting Electrode Application for Hydrogenated Amorphous Solar Cells; Proc. $5^{th}$ International Symposium on Advanced Materials (1997), pp. 226-231.
Roy G. Gordon; Desposition of Transparent Conducting Oxides for Solar Cells; Photovoltaics Program Review; edited by C. Edwin Witt et al; AIP Press, New York; 1997; pp. 39-48.
Keizo Ishiyama, et al; "Transparent Electrically Conductive ZnO Thin Films Prepared by Plasma CVD"; $63^{rd}$ Chemical Engineering Society (Fuita); Mar. 1998.
Wilson W. Wenas, High Growth Rate Transparent conducting Zinc-Oxide thin Film Prepared by Metalorganic Chemical Vapor Deposition Technique for Device Applications; Institute of Technologyo Bandung, JL.; Apr. 1999; 1999 IEEE; 322-324; Bandung Indonesia.
Kazuo Kondo et al; "Transparent Electrically Conductive ZnO Thin Films Prepared by Plasma CVD—The Effects of a Boron Dopant"; 64rd Chemical Engineering Society (Nagoya) Mar. 1999.
Young-Jim Kim, et at; "Trapped oxygen in the grain boundaries of ZnO polycrystalline thin films prepared by plasma-enhanced chemical vapor deposition;" Materials Letters 41 (1999) pp. 159-163.
J. Meier et al; "Efficiency Enhancement of Amorphous Silicon p-i-n Solar Cells by LP-CVD ZnO"; Institut de Microtechnique (IMT), A.L. Breguet 12, CH2000 Neuchatel; 2000 IEEE; pp. 746-749.
J. Loffler; et al, "Natively textured ZnO grown by PECVD as front electrode material for amorphous silicon pin solar cells"; Ultrecht University, Debye Institute, Physics of Devices; The Netherlands; 2000 IEEE; pp. 892-895.
Kazuo Kondo, et al; "Transparent Electrically Conductive ZnO Thin Films Prepared by Plasma CVD—The Effects of an Aluminum Dopant"; 65rd Chemical Engineering Society (Tokyo); Mar. 2000; pp. 1-7 (Japanese language version also attached).
B.S. Li; et al; "Effect of the growth temperature on ZnO thin films grown by plasma enhanced chemical vapor deposition"; Elsevier Science, B.V.; 2002; pp. 170-174.
B.S. Li et al; "Growth of high quality ZnO thin films at low temperature on Si(100) substrates by plasma enhanced chemical vapor deposition"; J. Vac. Sci. Technol. A 20(1); Jan./Feb. 2002; pp. 265-269.
J. Meier et al; "Enhanced Light-Trapping for Micromorph Tandem Solar Cells by LP-CVD ZnO"; Institut de Micotehnique (IMT), A.L. Breguet 2, CH-2000 Neuchatel; 2002 IEEE; pp. 1118-1121.
S. Fay et al; "Light Trapping Enhancement for Thin-Film Silicon Solar Cells by Roughness Improvement of the ZnO TCO"; $16^{th}$ European Photovoltaic Solar Energy Conference; May 1-5, 2000; Glasgow, UK; pp. 361-364.
A. Martin, et al; Preparation of transparent and conductive AI-doped ZnO thin films by ECR plasma enhanced CVD; Surface and Coating Technology 151-152 (2002) pp. 289-293.
K Ogata et al; ZnO growth on Si substrates by metalorganic vapor phase epitaxy; Journal of Crystal Growth 240; (2002) pp. 112-116.
Wilson K. Wenas; "Control of the Surface Morphology of ZnO Thin Films for Solar Cells by Novel Two-Step MOCVD Process";; Department of Physics, Institute of Technology Bandung, JI. Indonesia; 2002 IEEE; pp. 1130-1133.
Tora Aoki et al; "ZnO Film Deposition by Plasma Enhanced CVD Using Zinc-Acetylacetonate"; Electrochemical Society Proceedings vol. 2001-13; pp. 420-427.
Hu J, et al; "Deposition of Boron Doped Zinc Oxide Films and Their Electrical and Optical Properties"; Journal of the Electrochemical Society USA; vol. 139, No. 7; Jul. 1992; pp. 2014-2022; XP002421412.

Jianhua Hu, et al; "Textured Fluorine-Doped Zno Films by Atmospheric Pressure Chemical Vapor Deposition and Their Use in Amorphous Silicon Solar Cells"; Solar Cells, Elsevier Sequoia S.A. Lausanne, CH; vol. 30, No. 1/4; May 1, 1991; pp. 437-450; XP000243424.

Wenas W W, et al; "Electrical and Optical Properties of Boron-Doped ZnO Thin Films for Solar Cells Grown by Metalorganic Chemical Vapor Deposition"; Journal of Applied Physics USA; vol. 70, No. 11; Dec. 1, 1991; pp. 7119-7123; XP002421413.

Li B S, et al; "High Quality Zno Thin Films Grown by Plasma Enhanced Chemical Vapor Deposition"; Journal of Applied Physics, American Institute of Physics—New York; vol. 91, No. 1; Jan. 1, 2002; pp. 501-505; XP012054529.

Li B S, et al; "Growth of High Quality ZnO Thin Films at Low Temperature on Si(100) Substrates by Plasma Enhanced Chemical Vapor Deposition"; Journal of Vacuum Science and Technology A. Vacuum, Surfaces and Films, American Institute of Physics, New York, NY; vol. 20, No. 1; Jan. 2002; pp. 265-269; XP012005936.

Li B S, et al; "Growth of Stoichiometric (002) ZnO Thin Films on Si)001) Substrate by Using Plasma Enhanced Chemical Vapor Deposition"; Journal of Vacuum Science and Technology A. Vacuum, Surfaces and Films, American Institute of Physics, New York, NY; vol. 20, No. 5; Sep. 2002; pp. 1779-1783; XP012006196.

Li B S, et al; "Effect of the Growth Temperature on ZnO Thin Films Grown by Plasma Enhanced Chemical Vapor Deposition"; Preparation and Characterization, Elsevier Sequoia, NL; vol. 414, No. 2; Jul. 22, 2002; pp. 170-174; XP004374997.

Sang B, et al; "Textured ZnO Thin Films for Solar Cells Grown by a Two-Step Process with the Atomic Layer Deposition Technique"; Japanese Journal of Applied Physics, Part 2 (Letters) Publication Office, Japanese Journal Appl. Phys Japan; vol. 37, No. 2B; Feb. 15, 1998; pp. L206-L208; XP002421414.

Shimizu, M., et al; "Production and PL Property of ZnO Thin Film"; The Electric Communication Society Technical Research Report; vol. 82, No. 68; 1982; pp. 45-52.

* cited by examiner

METHOD FOR DEPOSITING ZINC OXIDE AT LOW TEMPERATURES AND PRODUCTS FORMED THEREBY

BACKGROUND OF THE INVENTION

The instant invention relates to depositing n-type and p-type ZnO-based transparent conducting oxides (TCO) at low temperatures (e.g., by plasma enhanced chemical vapor deposition (PECVD)) by using a mixture comprising at least one volatile organometallic zinc compound such as diethyl zinc (DEZ), at least one diluent gas such as argon or helium, at least one oxidant such as carbon dioxide and usually at least one volatile dopant or reactant. By using a relatively low deposition temperature, the inventive process permits depositing doped ZnO, ZnO co-deposited with other elements, Zn alloyed with other elements in oxide form on glass and temperature sensitive materials such as plastic and polymers. The inventive process achieves desirable electrical and optical properties of the doped, co-deposited or alloyed ZnO that permits deposition upon relatively rigid and fragile glass substrates used in many applications such as flat panel display. The inventive process can also permit replacement of glass substrates with relatively flexible and durable plastic or polymer substrates.

Undoped ZnO has been deposited on a wide variety of substrates at low temperatures by physical vapor deposition techniques such as sputtering and ion plating. Undoped ZnO can also be deposited on a substrate at low temperatures by PECVD using a mixture of organometallic zinc compound and oxygen, $N_2O$, or $CO_2$.

Doped ZnO films such as n-Type ZnO films co-deposited with Group III elements such as Al, Ga, Tl, Y, Sc, or In, and Group IV elements such as Ge, In, Sn, Ti, Zr, Pb or Hf and p-type ZnO with oxide of Group V element such as Sb, P, As, Bi, V, Nb, or Ta have been deposited on a wide variety of substrates at low temperatures by physical vapor deposition techniques such as sputtering and ion plating. The ZnO films co-deposited with above-mentioned elements have been shown to have useful electrical and optical properties. However, the growth rate of the doped ZnO films deposited by conventional physical vapor deposition techniques is ineffective.

B or Al-doped zinc oxide or ZnO mixed with oxides of other metals with good electrical and optical properties has been deposited at low temperatures by PECVD using a mixture of volatile zinc compound, boron compound as a dopant, and water, oxygen or nitrous oxide ($N_2O$) as an oxidant. If an organo-zinc complex (e.g., DEZ) is mixed either with water vapor, oxygen or $N_2O$, the complex instantaneously forms a solid, thereby contaminating the feed line as well as the substrate to be deposited by ZnO. Because a volatile zinc compound such as diethyl zinc or dimethyl zinc reacts violently with water vapors, oxygen or $N_2O$ well below the deposition temperatures, the reactants are introduced into the deposition chamber via separate lines. Since introducing reactants via separate feed lines makes it difficult, if not impossible, to achieve homogeneity of mixing and delivery of reactants uniformly to the substrate, it is difficult to deposit doped ZnO or ZnO mixed with oxides of other metals with good quality consistently and uniformly. This also prevents that process from depositing doped ZnO or ZnO mixed with oxides of other metals on large area substrates.

There is a need in this art for a process that is suitable for depositing low-resistivity doped ZnO for TCO application at low temperatures.

BRIEF SUMMARY OF THE INVENTION

The instant invention solves problems associated with conventional processes by providing a method for depositing n-type and p-type ZnO-based TCOs with desirable electrical and optical properties at low temperatures by PECVD using a combination or mixture comprising at least one volatile organometallic zinc compound such as diethyl zinc (DEZ), at least one diluent gas such as argon or helium, at least one oxidant such as carbon dioxide and usually at least one volatile dopant or reactant. The present invention also solves problems with conventional methods by utilizing reactants that do not react with each other at low temperatures (e.g., from about 20° C. to about 100° C.). Consequently, the reactants can be combined or mixed prior to introduction into the deposition chamber, thereby avoiding issues related to non-uniform deposition, consistency of deposition, and scaling the process for depositing films, layers or coatings on relatively large areas.

One aspect of the invention relates to forming a boron or fluorine doped ZnO films.

In another aspect of the invention, the reactive composition and reaction chamber or environment are substantially free of at least one of water and oxygen. By "substantially free" it is meant that less than about 100 ppm, usually less than about 10 ppm, and normally less than about 1 ppm of water or oxygen are present in the reaction mixture.

In another aspect of the invention, the ratio of $CO_2$ to DEZ in the reactive composition is greater than about 3 (e.g., greater than about 5.0 such as greater than about 10.0).

DETAILED DESCRIPTION OF THE INVENTION

The instant invention relates to zinc oxide films having low electrical resistance or high electrical conductivity, high infrared reflectance, and high visible transmittance. Because of these properties, such zinc oxide thin films can be used as a transparent conducting oxide (TCO) in energy efficient windows, solar cells, flat panel displays and other optoelectronic devices. The instant invention also relates to replacing rigid and fragile glass substrate coated with indium tin oxide (ITO) TCO currently being used in flat panel displays with substrates that are flexible, made of temperature sensitive materials such as plastics and polymers, and that are coated with doped ZnO.

The inventive process employs a gaseous feed mixture or reactive composition that has components that do not react with each other at ambient temperature. As a result the inventive process can: (1) improve the ability to mix reactants outside the deposition chamber and introduced them as a homogeneous mixture into the chamber, (2) avoid issues related to poor and inhomogeneous mixing of reactants in the deposition chamber such as non-uniform deposition of coating on a substrate, (3) avoid issues related to reactants reacting with each other prior to entering the chamber, (4) improve the ease of introducing reactants in the deposition chamber, and above all (5) improve the ease of scaling up the process to deposit coating on large areas.

The inventive ZnO films have a desirable low resistivity or high conductivity. Doped films of the invention normally have a resistivity of less than about 0.01 ohm-cm.

The inventive ZnO films also have desirable optical properties. Doped films of the invention normally have a transparency in the visible spectrum (wavelength varying between 400 to 800 nm) of at least about 80%.

The inventive ZnO films also have desirable infrared reflectance properties. Doped films of the invention normally have a reflectance in the infrared spectrum (wavelength varying between 1200 to 3000 nm) of at least about 50%.

The inventive ZnO films normally have a thickness that ranges from about 50 nm to about 400 nm. The thickness can be varied by varying the deposition time, plasma power or plasma frequency.

An organo-zinc compound such as dimethyl zinc or diethyl zinc has little or no reaction with $CO_2$ at ambient temperatures (e.g., about 20° C. to about 100° C.). Such compounds can be blended with $CO_2$ (and other components of the reactive compositions), before entering the reaction chamber without premature reaction between zinc compounds and $CO_2$. This blend or reactive composition can be used for depositing doped zinc oxide, ZnO co-deposited with oxides of other elements, or ZnO alloyed with other elements.

In one aspect, the instant invention relates to a low-temperature PECVD process for depositing n-type and p-type zinc oxide-based transparent conducting oxides (TCOs) at low temperatures with useful optical and electrical properties on glass and temperature sensitive materials such as plastics and polymers. For example, the instant invention can comprise a PECVD process for depositing n-type ZnO by doping ZnO with B or F, or p-type ZnO by doping the ZnO with nitrogen thereby obtaining a surface useful in TCO applications (e.g., doped ZnO on glass and temperature sensitive materials such as plastics and polymers). The instant invention also comprises a PECVD process for co-depositing n-type ZnO with at least one oxide of Group III elements such as Al, Ga, Tl, Y, Sc, or In, and/or at least one Group IV elements such as Ge, Sn, Ti, Zr, Pb or Hf and p-type ZnO with oxide of Group V element such as Sb, P, As, Bi, V, Nb, or Ta.

The inventive ZnO-based TCO can be deposited in a plasma enhanced CVD reactor. The PECVD reactor can be selected from inductively coupled RF PECVD reactor, capacitively coupled DC or RF PECVD reactor, microwave or ECR PECVD reactor, and a UV activated reactor. A capacitively coupled RF PECVD reactor is useful for depositing doped ZnO films because of ease of scaling up or increasing the size of the system.

The activation frequency used in a capacitively coupled RF PECVD reactor can vary from about 50 KHz to about 50 MHz, usually from about 5 MHz to about 30 MHz, and typically from about 10 MHZ to about 20 MHz.

The PECVD reactor can be operated at a total pressure (or vacuum) varying from about 1 millitorr to about 50 torr, usually from about 10 millitorr to about 25 torr, typically from about 50 millitorr to about 10 torr for depositing doped ZnO coating.

The reaction temperature can be selected from about ambient temperature to about 300° C., usually from about 50° C. to about 250° C., and typically from about 100° C. to about 200° C. A temperature varying between about 100° C. and about 300° C., usually between about 200° C. and about 300° C. is used for depositing ZnO-based TCO on glass. A temperature below about 200° C. is used for depositing ZnO-based TCO on relatively temperature sensitive substrates such as plastics and polymers.

In one aspect of the invention, the substrate used for depositing ZnO comprises a plastic or polymeric material. The plastic and polymeric substrates can comprise at least one member be selected from the group consisting of polypropylene, polycarbonate, polyethylene terephthalate, polyethersulfone and polyimide, mixtures thereof, among others.

In another aspect of the invention, the reactive composition used in the inventive process comprises at least one organo-zinc compound, at least one diluent or inert carrier gas (e.g., argon, helium, among others), at least one oxidant such as carbon dioxide, and at least one dopant or reactant. The amount of organo-zinc compound ranges from about 0.1% to about 10% of the reactive composition. The amount of diluent or inert carrier normally ranges from about 40% to about 99% of the reactive composition. These reactants are mixed prior to introducing them into the PECVD chamber. If desired, hydrogen gas can also be mixed with these reactants for depositing doped ZnO films. The amount of hydrogen usually ranges from about 2% to about 50% of the reactive composition.

Any suitable zinc compound can be used in the inventive reactive composition. Examples of suitable compounds comprise organo-zinc compounds such as $Zn(R)(R')$, where R and R' are alkyl, fluoroalkyl, acetylacetonate, hexafluoroacetylacetonate, among others. The organo-zinc compound can comprise at least one zinc compounds selected from the group consisting of dimethyl zinc, diethyl zinc, zinc acetylacetate and zinc acetylacetonate. Normally the ratio of $CO_2$ to zinc compound in the reactive composition is greater than about 3 (e.g., greater than about 5.0 such as greater than about 10.0).

At least one fluorine compound comprising at least one member selected from the group consisting of $NF_3$, HF, $CF_4$, $CHF_3$, $CH_2F_2$, $CH_3F$, $CF_2O$, $C_2F_6$, $C_2F_4$, $C_2F_4O$, $C_2HF_3$, $C_2HF_5$, $C_2H_2F_2$, $C_2H_2F_4$, $C_2H_5F$, $C_3HF_3$, $C_3HF_5$, $C_3HF_7$, $C_3H_2F_6$, $C_3H_3F_3$, $C_3H_3F_5$, $C_3H_7F$, $C_3F_6$, $C_3F_6O$, $C_4F_6$, $C_4F_8$, $C_2F_6$, $C_3F_8$, mixtures thereof, among others can be used for doping ZnO with fluorine. The fluorine compound is mixed with other reactants prior to introducing it into the PECVD chamber. The amount of fluorine compound usually ranges from about 0.001% to about 5% of the reactive composition.

At least one boron compound comprising at lest one member selected from the group consisting of $B_2H_6$, borazine ($H_6B_3N_3$), trimethylboroxine ($C_3H_9B_3O_3$), trimethoxyboroxine ($C_3H_9B_3O_6$), and $R_3B$, where R=$CH_3$, $CH_3O$, $CH_3CH_2$, $CH_3CH_2O$, $CH_3CH_2CH_2$, $CH_3CH_2CH_2O$, $(CH_3)_2CH_2$, $(CH_3)_2CH_2O$, mixtures thereof, among others, can be used for doping ZnO with boron. It is desirable to use less toxic boron compounds such as triethylboron and triethoxyborate for doping ZnO with boron. The boron compound is mixed with other components of the reactive composition prior to introducing the reactive composition into the chamber. The amount of boron compound usually ranges from about 0.001% to about 5% of the reactive composition.

Organometallic aluminum compounds with a formula comprising Al $(R)(R')(R'')$ where R, R' and R'' are alkyl, alkoxy, acetylacetonate, hexafluoroacetylacetonate, 2,2,6,6-tetramethyl-3,5-heptanedionato, among others can be added to the reactive composition and used to co-deposit aluminum or alloy aluminum with zinc in an oxide form. The amount of organo-aluminum compound ranges from about 0.1% to about 10% of the reactive composition.

Organometallic antimony compounds with a formula comprising Sb $(R)(R')(R'')$ where R, R' and R'' are H, alkyl, alkoxy, phenyl, dialkylamino, acetylacetonate, hexafluoroacetylacetonate, 2,2,6,6-tetramethyl-3,5-heptanedionato, among others and $SbH_3$, can be added to the reactive composition and used to co-deposit antimony or alloy antimony with zinc in an oxide form. The amount of antimony compound ranges from about 0.1% to about 10% of the reactive composition.

Organometallic arsine compounds with a formula comprising As (R)(R')(R") where R, R' and R" are H, alkyl, alkoxy, phenyl, dialkylamino, acetylacetonate, hexafluoroacetylacetonate, 2,2,6,6-tetramethyl-3,5-heptanedionato, among others and $AsH_3$, can be added to the reactive composition and used to co-deposit arsine or alloy arsine with zinc in an oxide form. The amount of arsine compound ranges from about 0.1% to about 10% of the reactive composition.

Organometallic bismuth compounds with a formula comprising Bi (R)(R')(R") where R, R' and R" are H, alkyl, alkoxy, phenyl, dialkylamino, acetylacetonate, hexafluoroacetylacetonate, 2,2,6,6-tetramethyl-3,5-heptanedionato, among others can be added to the reactive composition and used to co-deposit bismuth or alloy bismuth with zinc in an oxide form. The amount of bismuth compound ranges from about 0.1% to about 10% of the reactive composition.

Organometallic gallium compounds with a formula comprising Ga (R)(R')(R") where R, R' and R" are H, alkyl, alkoxy, dialkylamino, acetylacetonate, hexafluoroacetylacetonate, 2,2,6,6-tetramethyl-3,5-heptanedionato, among others, can be added to the reactive composition and used to co-deposit gallium or alloy gallium with zinc in an oxide form. The amount of gallium compound ranges from about 0.1% to about 10% of the reactive composition.

Organometallic germanium compounds with a formula comprising Ge(R)(R')(R")(R'") where R, R', R" and R'" are H, alkyl, alkoxy, phenyl, among others, and $GeH_4$ can be added to the reactive composition and used to co-deposit germanium or alloy germanium with zinc in an oxide form. The amount of germanium compound ranges from about 0.1% to about 10% of the reactive composition.

Organometallic hafnium compounds with a formula comprising Hf(R)(R')(R")(R'") where R, R', R" and R'" are alkoxy, dialkylamino, acetylacetonate, among others, can be added to the reactive composition and used to co-deposit hafnium or alloy hafnium with zinc in an oxide form. The amount of hafnium compound ranges from about 0.1% to about 10% of the reactive composition.

Organometallic indium compounds with a formula comprising In (R) or In (R)(R')(R") where R, R' and R" are alkyl, cyclopentadienyl, alkoxy, dialkylamino, acetylacetonate, hexafluoroacetylacetonate, 2,2,6,6-tetramethyl-3,5-heptanedionato, among others can be added to the reactive composition and used to co-deposit indium or alloy indium with zinc in an oxide form. The amount of indium compound ranges from about 0.1% to about 10% of the reactive composition.

Organometallic lead compounds with a formula comprising Pb(R)(R') and Pb(R)(R')(R")(R'") where R, R', R" and R'" are alkyl, alkoxy, acetylacetonate, hexafluoroacetylacetonate, 2,2,6,6-tetramethyl-3,5-heptanedionato, among others can be added to the reactive composition and used to co-deposit lead or alloy lead with zinc in an oxide form. The amount of lead compound ranges from about 0.1% to about 10% of the reactive composition.

Organometallic niobium compounds with a formula comprising Nb(R)(R')(R")(R'")(R"") where R, R', R", R'" and R"" are alkoxy, dialkylamino, acetylacetonate or other betadiketonate, among others can be added to the reactive composition and used to co-deposit niobium or alloy niobium with zinc in an oxide form. The amount of niobium compound ranges from about 0.1% to about 10% of the reactive composition.

Organometallic phosphorus compounds with a formula comprising P (R)(R')(R") where R, R' and R" are H, alkyl, alkoxy, phenyl, dialkylamino, acetylacetonate, hexafluoroacetylacetonate, 2,2,6,6-tetramethyl-3,5-heptanedionato, among others and PH3, can be added to the reactive composition and used to co-deposit phosphorus or alloy phosphorus with zinc in an oxide form. The amount of phosphorous compound ranges from about 0.1% to about 10% of the reactive composition.

Organometallic scandium compounds with a formula comprising Sc (R)(R')(R") where R, R' and R" are alkoxy, cyclopentadienyl, dialkylamino, acetylacetonate, hexafluoroacetylacetonate, 2,2,6,6-tetramethyl-3,5-heptanedionato, or other betadiketonate, among others can be added to the reactive composition and used to co-deposit scandium or alloy scandium with zinc in an oxide form. The amount of scandium compound ranges from about 0.1% to about 10% of the reactive composition.

Organometallic tantalum compounds with a formula comprising Ta(R)(R')(R")(R'")(R"") where R, R', R", R'" and R"" are alkoxy, dialkylamino, acetylacetonate or other betadiketonate, among others can be added to the reactive composition and used to co-deposit tantalum or alloy tantalum with zinc in an oxide form. The amount of tantalum compound ranges from about 0.1% to about 10% of the reactive composition.

Organometallic titanium compounds with a formula comprising Ti(R)(R')(R")(R'") where R, R', R" and R'" are alkoxy, cyclopentadienyl, dialkylamino, acetylacetonate, among others can be added to the reactive composition and used to co-deposit titanium or alloy titanium with zinc in an oxide form. The amount of titanium compound ranges from about 0.1% to about 10% of the reactive composition.

Organometallic thallium compounds with a formula comprising Tl-R and Tl (R)(R')(R") where R, R' and R" are alkoxy, cyclopentadienyl, acetylacetonate, hexafluoroacetylacetonate, 2,2,6,6-tetramethyl-3,5-heptanedionato, among others can be added to the reactive composition and used to co-deposit indium or alloy indium with zinc in an oxide form. The amount of thallium compound ranges from about 0.1% to about 10% of the reactive composition.

Organometallic tin compounds with a formula comprising Sn(R)(R')(R")(R'") where R, R', R" and R'" are H, alkyl, alkoxy, phenyl, among others, can be added to the reactive composition and used to co-deposit tin or alloy tin with zinc in an oxide form. The amount of tin compound ranges from about 0.1% to about 10% of the reactive composition.

Organometallic vanadium compounds with a formula comprising V(R)(R') or V(R)(R')(R") where R, R' and R" are alkoxy, cyclopentadienyl, acetylacetonate, hexafluoroacetylacetonate, 2,2,6,6-tetramethyl-3,5-heptanedionato, or other betadiketonate, among others, can be added to the reactive composition and used to co-deposit vanadium or alloy vanadium with zinc in an oxide form. The amount of vanadium compound ranges from about 0.1% to about 10% of the reactive composition.

Organometallic yttrium compounds with a formula comprising Y(R)(R')(R") where R, R' and R" are alkoxy, acetylacetonate, hexafluoroacetylacetonate, 2,2,6,6-tetramethyl-3,5-heptanedionato, or other betadiketonate, among others can be added to the reactive composition and used to co-deposit yttrium or alloy yttrium with zinc in an oxide form. The amount of yttrium compound ranges from about 0.1% to about 10% of the reactive composition.

Organometallic zirconium compounds with a formula comprising Zr(R)(R')(R")(R'") where R, R', R" and R'" are alkoxy, dialkylamino, acetylacetonate, among others, can be added to the reactive composition and used to co-deposit zirconium or alloy zirconium with zinc in an oxide form. The amount of zirconium compound ranges from about 0.1% to about 10% of the reactive composition.

In one aspect of the invention, nitrogen containing gases and compounds such as at least one member of the group consisting of nitrogen, remotely activated nitrogen and ammonia, can be used to alloy nitrogen with ZnO. The nitrogen containing gases or compounds are also combined with the reactive composition before entering the PECVD reactor. The amount of nitrogen compound other than nitrogen gas ranges from about 0.1% to about 10% of the reactive composition.

The reactive composition can further comprise at least one diluent or inert carrier gas comprising at least one member selected from the group consisting of argon, helium, xenon, krypton, neon, nitrogen, and mixtures thereof. In one aspect, the inert carrier gas comprises argon, helium or a mixture of argon and helium. The selected inert gas is used to carry and deliver organo-zinc compound and in some cases a dopant or a reactant.

The flow rate of the reaction mixture, operating pressure, operating temperature, among other process parameters vary depending upon the power and frequency of the plasma system. These parameters can be controlled and monitored by methods known in this art.

Figure 1:
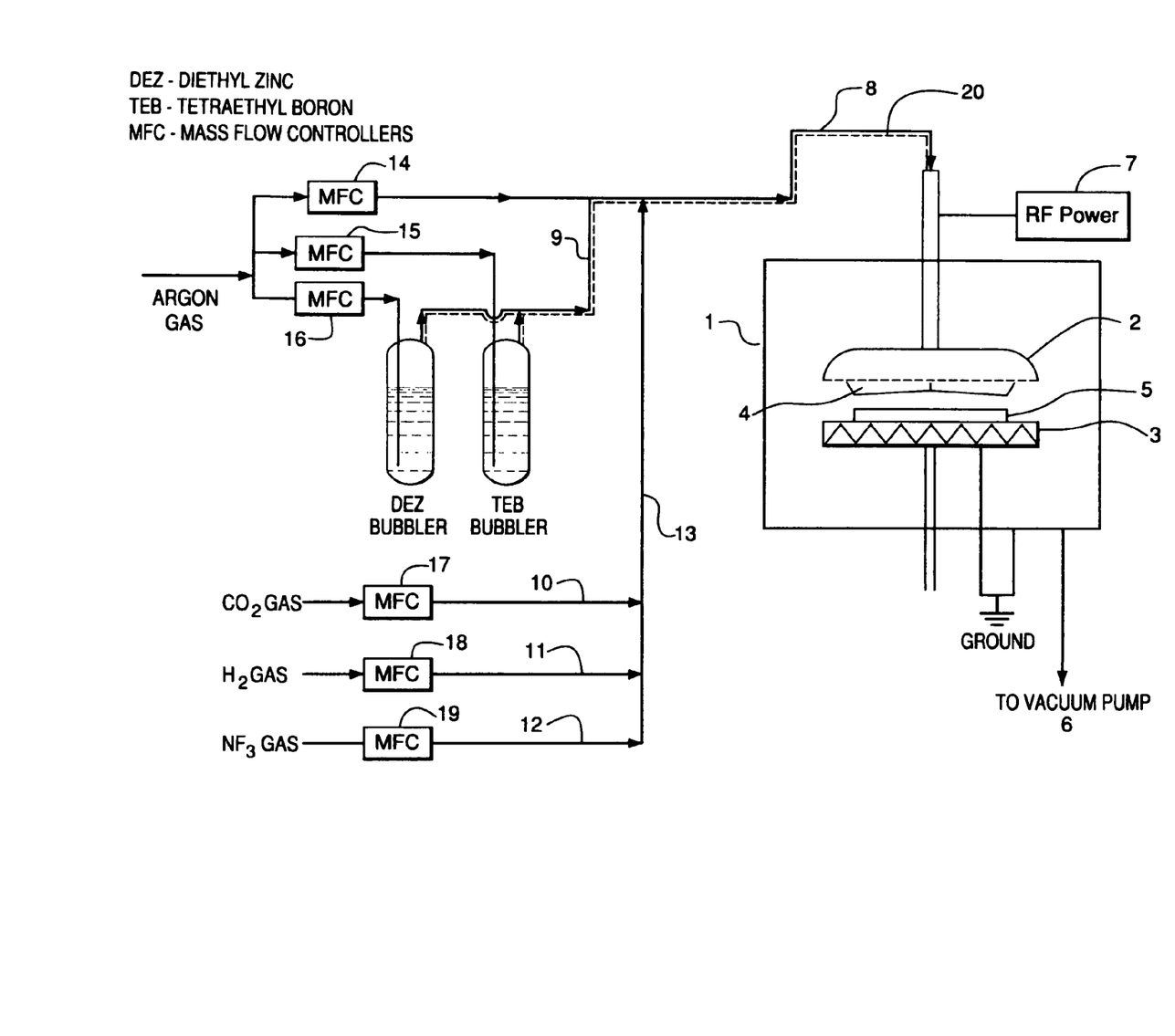
FIG. 1 is a schematic diagram of one aspect of the instant invention illustrating a PECVD reactor system.

In one aspect of the invention, the components of the reactive composition are combined or blended or mixed well or homogenized prior to entering the reaction chamber (e.g., PECVD). While any suitable reactor can be employed for practicing the instant invention, one such reactor and supply system is illustrated in FIG. 1. Referring now to FIG. 1, FIG. 1 illustrates a capacitively coupled PECVD reactor 1 that was used to conduct the Examples below which demonstrates the applicability of present invention to deposit undoped and F- and B-doped ZnO. The reactor 1 consisted of a ~3.5 inch diameter top electrode 2 and a 2 inch×3 inch bottom electrode 3 enclosed in a glass bell jar. The top aluminum electrode 2 was in the form of a "shower head" that was connected to a single feed line 8 to introduce a previously combined mixture of reactants. Shower head refers to a chamber, plenum or other structure having a plurality of openings that release previously combined reactants into the PECVD reactor. The shower head 2 had a plurality of small diameter holes 4 to facilitate uniform distribution of reactants on the substrate 5 that was place on the top of the bottom electrode 3. It was also connected to 13.56 MHz RF power source 7 and a matching network to generate plasma. The bottom electrode 3 was made of graphite with a built-in heater and a thermocouple (not shown). The thermocouple was used to monitor and control temperature of substrates 5 to be coated with ZnO. The bottom electrode 3 was grounded to complete the circuit. The bell jar enclosure sat on a steel table support. It had an opening 6 at the bottom to pull vacuum and evacuate product gases from the deposition chamber 1. The distance between the top 2 and bottom electrode 3 was adjusted by moving up or down the top electrode 2.

The shower head 2, as mentioned above, was connected to a main feed line 8 that was connected to other lines (9, 10, 11, 12 and 13). A mixture of reactants including organo-zinc compound, fluorine- or boron-containing dopant (if any), carrier argon or helium, and carbon dioxide were introduced into the reactor via the feed line 8. In some cases hydrogen gas was also mixed with the reactants. All the reactants were metered using mass flow controllers (14, 15, 16, 17, 18 and 19). The main feed line 8 contained static mixing elements (not shown) to ensure complete and uniform mixing of all reactants prior to entering the deposition chamber 1. The lines 8 and 9 (and other lines as desired) are heated by a heat tracing 20 that comprises electrically operated flexible heat tapes or steam or heated fluid traced lines.

The following Examples are provided to illustrate certain aspects of the invention and do not limit the scope of the invention or the claims appended hereto.

EXAMPLES

Undoped and doped ZnO films were deposited by using the operating procedure given below. The procedure comprises cleaning the substrate with an appropriate organic solvent and loading it in the PECVD reactor. The reactor was then checked for leaks by pulling vacuum. Once the reactor was found to be leak tight, a predetermined flow rate of argon or helium gas was established through the showerhead into the reactor while maintaining a predetermined pressure or vacuum in the reactor. The substrate was then heated to the desired temperature. The surface of the substrate was argon or helium plasma cleaned by striking plasma between the two electrodes for 1 to 30 minutes while maintaining the substrate temperature. After plasma cleaning the substrate, the RF power was turned off and the desired flow rate of carbon dioxide was established into the reactor through the shower head. The flow rate of the doping gas, if used, was also established into the reactor through the shower head. After waiting for a few minutes, the flow rate of an organo-zinc compound was established into the reactor again through the shower head to start depositing undoped or doped ZnO. The flow of all reactants was continued for the desired amount of time. Thereafter, the flow of all reactants with the exception of argon or helium was terminated, and the power to graphite heater was turned off. The substrate was cooled under flowing argon or helium gas. The substrate deposited with ZnO deposit was removed from the chamber and analyzed for deposit thickness, sheet resistance, and optical transmission characteristics. The resistivity of ZnO films was calculated by multiplying sheet resistance with deposit thickness.

Examples for Depositing Undoped ZnO

Control Example 1

Undoped ZnO film was deposited on two 1-inch×1-inch pieces, one each of glass and silicon, in the PECVD reactor described earlier using diethyl zinc (DEZ) as an organo-zinc compound and carbon dioxide as an oxidant. DEZ flow of 1 sscm, $CO_2$ flow of 6 sccm and argon flow of 20 sccm were used for depositing undoped ZnO film at 300° C. temperature and 0.8 torr pressure. The $CO_2$/DEZ ratio in the feed gas was 6. An electrode spacing of 2.8 cm and RF power of 35 Watts were used to deposit film for 35 minutes.

The glass and silicon substrates were deposited with ~80 nm thick undoped ZnO film with a dark brown color. This example showed that a DEZ/$CO_2$ ratio of 6 is not high enough to deposit colorless and transparent undoped ZnO film at 300° C.

Control Example 2

The experiment in Control Example 1 was repeated to deposit undoped ZnO film in the PECVD reactor. DEZ flow of 0.5 sscm, $CO_2$ flow of 6 sccm and argon flow of 10 sccm were used for depositing undoped ZnO film at 300° C. temperature and 0.6 torr pressure. The $CO_2$/DEZ ratio in the feed gas was 12. An electrode spacing of 2.8 cm and RF power of 35 Watts were used to deposit film for 30 minutes.

The glass and silicon substrates were deposited with 97 nm thick colorless and transparent undoped ZnO film with 7216 ohm/square sheet resistance (or 0.07 ohm-cm resistivity). This example showed that a $CO_2$/DEZ ratio close to 12 can be used to deposit colorless and transparent undoped ZnO film with high sheet resistance at 300° C. This undoped ZnO film with high sheet resistance is not suitable for TCO application.

Control Example 3

The experiment in Control Example 1 was repeated to deposit undoped ZnO film in the PECVD reactor. DEZ flow of 0.5 sscm, $CO_2$ flow of 6 sccm, argon flow of 18 sccm, and 1.5 sccm of hydrogen were used for depositing undoped ZnO film at 300° C. temperature and 0.8 torr pressure. The $CO_2$/DEZ ratio in the feed gas was 12. An electrode spacing of 2.8 cm and RF power of 15 Watts were used to deposit film for 15 minutes.

The glass and silicon substrates were deposited with 108 nm thick colorless and transparent undoped ZnO film with 8333 ohm/square sheet resistance (or 0.09 ohm-cm resistivity). This example showed that a $CO_2$/DEZ ratio close to 12 can be used to deposit colorless and transparent undoped ZnO film with high sheet resistance at 300° C. Furthermore, it showed that hydrogen gas could be added to the feed mixture for depositing ZnO films. This undoped ZnO film with high sheet resistance is not suitable for TCO application.

Control Example 4

The experiment in Control Example 1 was repeated to deposit undoped ZnO film in the PECVD reactor. DEZ flow of 0.5 sscm, $CO_2$ flow of 6 sccm, and argon flow of 52 sccm were used for depositing undoped ZnO film at 200° C. temperature and 1.8 torr pressure. The $CO_2$/DEZ ratio in the feed gas was 12. An electrode spacing of 2.5 cm and RF power of 30 Watts were used depositing film for 40 minutes.

The glass and silicon substrates were deposited with 132 nm thick colorless and transparent undoped ZnO film with 4542 ohm/square sheet resistance (or 0.06 ohm-cm resistivity). This example showed that a $CO_2$/DEZ ratio close to 12 can be used to deposit colorless and transparent undoped ZnO film with high sheet resistance at a low temperature of 200° C. This undoped ZnO film with high sheet resistance is not suitable for TCO application.

Control Examples 5 to 8

The experiment in Control Example 1 was repeated four times in to study the effect of $CO_2$/DEZ ratio in the reaction mixture on depositing undoped ZnO film in the PECVD reactor. A fixed DEZ flow of 0.5 sscm, argon flow of 36 sccm, electrode spacing of 2.4 cm, RF power of 35 watts, deposition time of 30 minutes, 1.8 torr pressure, and 200° C. temperature were used in these examples for depositing undoped ZnO. The flow rate of $CO_2$ was varied from 3 sccm to 6 sccm to provide a $CO_2$/DEZ ratio varying from 6 to 12.

The results from these experiments in Table 1 below show that above mentioned conditions can indeed be used to deposited undoped ZnO with high resistance. The results also show that a high $CO_2$/DEZ ratio (higher than 10) is useful to deposit optically transparent and colorless ZnO film.

TABLE 1

| Control Example No. | Crabon Dioxide/ DEZ Ratio | Thickness in nm | Resistivity ohm-cm | Transparency in the Visible Region 400 to 800 nm wavelength | Comments |
|---|---|---|---|---|---|
| 5 | 6.00 | 62 | 0.4 | 50 to 60% | Dark Brown |
| 6 | 8.00 | 71 | 0.2 | 60 to 65% | Light Brown |
| 7 | 10.00 | 69 | 0.3 | 72 to 83% | Light Brown |
| 8 | 12.00 | 78 | 0.3 | >80% | Transparent |

Examples for Depositing Fluorine-Doped ZnO

Example 1

Fluorine-doped ZnO film was deposited on two 1-inch×1-inch pieces, one each of glass and silicon, in the PECVD reactor described earlier using diethyl zinc (DEZ) as an organo-zinc compound, carbon dioxide as an oxidant and $NF_3$ as a dopant. DEZ flow of 0.5 sscm, $CO_2$ flow of 6 sccm, $NF_3$ flow of 0.15 sccm, and argon flow of 20.85 sccm were used for depositing fluorine-doped ZnO film at 300° C. temperature and 0.85 torr pressure. The $CO_2$/DEZ ratio in the feed gas was 12. An electrode spacing of 2.8 cm and RF power of 40 Watts were used to deposit film for 40 minutes.

The glass and silicon substrates were deposited with ~107 nm thick fluorine-doped ZnO film. The film was colorless and transparent and showed better than 80% transparency in the 400 to 800 nm wavelength region. The sheet resistance of the film was 373 ohm/square and the film resistivity was 0.004 ohm-cm. This example showed that fluorine doped ZnO film with good electrical and optical properties could be deposited by PECVD at 300° C. Furthermore, it showed that the electrical and optical properties of fluorine-doped ZnO were good enough for TCO application on glass.

Example 2

The experiment in Example 1 was repeated to deposit fluorine-doped ZnO film in the PECVD reactor. DEZ flow of 0.5 sscm, $CO_2$ flow of 6 sccm, $NF_3$ flow of 0.02 sccm, and argon flow of 64.5 sccm were used for depositing fluorine-doped ZnO film at 225° C. temperature and 1.8 torr pressure. The $CO_2$/DEZ ratio in the feed gas was 12. An electrode spacing of 2.7 cm and RF power of 30 Watts were used to deposit film for 40 minutes.

The glass and silicon substrates were deposited with ~126 nm thick fluorine-doped ZnO film. The film was colorless and transparent and showed better than 80% transparency in the 400 to 800 nm wavelength region. The sheet resistance of the film was 325 ohm/square and the film resistivity was 0.004 ohm-cm. This example showed that fluorine doped ZnO film with good electrical and optical properties could be deposited by PECVD at 225° C. Furthermore, it showed that the electrical and optical properties of fluorine-doped ZnO were good enough for TCO application on glass.

Example 3

The experiment in Example 1 was repeated to deposit fluorine-doped ZnO film in the PECVD reactor. DEZ flow of 0.5 sscm, $CO_2$ flow of 6 sccm, $NF_3$ flow of 0.02 sccm, and argon flow of 64.5 sccm were used for depositing fluorine-doped ZnO film at 210° C. temperature and 1.8 torr pressure. The $CO_2$/DEZ ratio in the feed gas was 12. An electrode spacing of 2.7 cm and RF power of 30 Watts were used to deposit film for 40 minutes.

The glass and silicon substrates were deposited with ~128 nm thick fluorine-doped ZnO film. The film was colorless and transparent and showed better than 80% transparency in the 400 to 800 nm wavelength region. The sheet resistance of the film was 242 ohm/square and the film resistivity was 0.0031 ohm-cm. This example showed that fluorine doped ZnO film with good electrical and optical properties could be deposited by PECVD at 200° C. Furthermore, it showed that the electrical and optical properties of fluorine-doped ZnO were good enough for TCO application on glass and temperature sensitive flexible substrates such as plastics and polymers.

Examples for Depositing Boron-Doped ZnO

Example 4

Boron-doped ZnO film was deposited on two 1-inch×1-inch pieces, one each of glass and silicon, in the PECVD reactor described earlier using diethyl zinc (DEZ) as an organo-zinc compound, carbon dioxide as an oxidant and triethyl boron (TEB) as a dopant. DEZ flow of 0.5 sscm, $CO_2$ flow of 6 sccm, TEB flow of 0.0993 sccm, and argon flow of 51.5 sccm were used for depositing boron-doped ZnO film at 200° C. temperature and 1.8 torr pressure. The $CO_2$/DEZ ratio in the feed gas was 12. An electrode spacing of 2.4 cm and RF power of 30 Watts were used to deposit film for 60 minutes.

The glass and silicon substrates were deposited with ~131 nm thick boron-doped ZnO film. The film was colorless and transparent and showed better than 80% transparency in the 400 to 800 nm wavelength region. The sheet resistance of the film was 98 ohm/square and the film resistivity was 0.0012 ohm-cm. This example showed that boron doped ZnO film with good electrical and optical properties could be deposited by PECVD at 200° C. Furthermore, it showed that the electrical and optical properties of boron-doped ZnO were good enough for TCO application on glass and temperature sensitive flexible substrates such as plastics and polymers.

Example 5

The experiment in Example 4 was repeated to deposit boron-doped ZnO film in the PECVD reactor. DEZ flow of 0.5 sscm, $CO_2$ flow of 6 sccm, TEB flow of 0.05696 sccm, and argon flow of 49.5 sccm were used for depositing boron-doped ZnO film at 200° C. temperature and 1.8 torr pressure. The $CO_2$/DEZ ratio in the feed gas was 12. An electrode spacing of 2.4 cm and RF power of 30 Watts were used to deposit film for 75 minutes.

The glass and silicon substrates were deposited with ~133 nm thick boron-doped ZnO film. The film was colorless and transparent and showed better than 80% transparency in 400 to 800 nm wavelength region. The sheet resistance of the film was 59 ohm/square and the film resistivity was 0.0008 ohm-cm. This example showed that boron doped ZnO film with good electrical and optical properties could be deposited by PECVD at 200° C. Furthermore, it showed that the electrical and optical properties of boron-doped ZnO were good enough for TCO application on glass and temperature sensitive flexible substrates such as plastics and polymers.

Example 6

The experiment in Example 4 was repeated to deposit boron-doped ZnO film in the PECVD reactor. DEZ flow of 0.5 sscm, $CO_2$ flow of 6 sccm, TEB flow of 0.0569 sccm, and argon flow of 49 sccm were used for depositing boron-doped ZnO film at 200° C. temperature and 1.8 torr pressure. The $CO_2$/DEZ ratio in the feed gas was 12. An electrode spacing of 2.4 cm and RF power of 35 Watts were used to deposit film for 180 minutes.

The glass and silicon substrates were deposited with ~362 nm thick boron-doped ZnO film. The film was colorless and transparent and showed better than 80% transparency in 400 to 800 nm wavelength region. The sheet resistance of the film was 9.4 ohm/square and the film resistivity was 0.00034 ohm-cm. The infrared reflectance of the film at 2000 and 3000 nm wavelength was about 80% and 96%, respectively. This example showed that boron doped ZnO film with good electrical and optical properties could be deposited by PECVD at 200° C. Furthermore, it showed that the electrical and optical properties of boron-doped ZnO were good enough for TCO application on glass and temperature sensitive flexible substrates such as plastics and polymers.

Examples 7 to 9

The experiment in Example 4 was repeated three times in to study the effect of $CO_2$/DEZ ratio in the reaction mixture on depositing boron-doped ZnO film in the PECVD reactor. A fixed DEZ flow of 0.5 sscm, argon flow of 48.8 sccm, TEB flow of 0.0583 sccm, electrode spacing of 2.4 cm, RF power of 35 watts, 1.8 torr pressure, and 200° C. temperature were used in these examples for depositing boron-doped ZnO. The flow rate of $CO_2$ was varied from 3 sccm to 6 sccm to provide a $CO_2$/DEZ ratio varying from 6 to 12. The deposition time was varied from 35 to 90 minutes, as shown in Table 2 below.

The results from these experiments in Table 2 show that above mentioned conditions can indeed be used to deposited boron ZnO with high and low electrical resistance depending upon the deposition conditions. The results also show that a high $CO_2$/DEZ ratio (higher than 10) is useful to deposit optically transparent and colorless ZnO film. Furthermore, the results show that a high $CO_2$/DEZ ratio (higher than 10) is useful to deposit boron-doped ZnO with low electrical resistivity.

TABLE 2

| Example No. | Crabon Dioxide/ DEZ Ratio | Deposition Time in Minutes | Thickness in nm | Resistivity ohm-cm | Transparency in the Visible Region 400 to 800 nm wavelength | Comments |
| --- | --- | --- | --- | --- | --- | --- |
| 7 | 6.00 | 35 | <50 | −0.2 | 62 to 72% | Dark Brown |
| 8 | 8.00 | 60 | 122 | 0.08 | 68 to 75% | Light Brown |
| 9 | 12.00 | 90 | 122 | 0.0018 | >83% | Transparent |

The present invention is not limited in scope by the specific embodiments disclosed in the Examples or any aspects disclosed herein. Various modifications of the invention in addition to those shown and described herein will become apparent to those skilled in this art and are intended to fall within the scope of the appended claims.

The invention claimed is:

1. A method for depositing a doped zinc oxide upon a substrate comprising:
    combining at least one organometallic zinc compound, at least one diluent, carbon dioxide and least one fluorine or boron dopant to form a reactive composition wherein the ratio of carbon dioxide to said at least one organometallic zinc compound is at least about 8.0 and the reactive composition is substantially free of water and oxygen,
    introducing the reactive composition into a deposition chamber, and;
    creating a plasma enhanced chemical vapor deposition environment within the deposition chamber for a time and under conditions sufficient to deposit doped zinc oxide upon the substrate wherein the resistivity of the doped zinc oxide is less than about 0.01 ohm-cm and the transparency in the visible spectrum is at least about 80%.

2. The method of claim 1 wherein the reactive composition comprises diethyl zinc, argon, carbon dioxide and triethyl boron.

3. The method of claim 1 wherein the reactive composition comprises diethyl zinc, argon, carbon dioxide and nitrogen trifluoride.

4. The method of claim 1 wherein the ratio of carbon dioxide to the zinc compound is greater than about 10.0.

5. The method of claim 1 wherein the substrate comprises glass.

6. The method of claim 1 wherein the substrate comprises at least one member selected from the group consisting of polyproplylene, polycarbonate, polyethylene terepthalate, polyethersulfone and polyamide.

7. The method of claim 1 wherein the dopant comprises at least one member selected from the group consisting of boron and fluorine and wherein the transparency is at least about 80%.

8. The method of claim 1 wherein the substrate temperature of less than about 350 C.

9. The method of claim 8 wherein the substrate temperature is less than about 200 C.

10. A method for depositing doped zinc oxide upon a substrate, the method comprising:
providing a composition comprising diethyl zinc, at least one diluent, carbon dioxide and at least one boron or fluorine dopant wherein the composition is substantially free of water and $O_2$ and substantially non-reactive under ambient conditions and the ratio of carbon dioxide to diethyl zinc is at least about 8.0,
introducing the composition into a deposition chamber, and;
exposing the composition to a PECVD environment within the deposition chamber at a temperature of less than about 200° C. for a time and under conditions sufficient to deposit doped zinc oxide upon a substrate comprising at least one member selected from the group consisting of polyproplylene, polycarbonate, polyethylene terepthalate, polyethersulfone and polyamide wherein the doped zinc oxide is at least about 80% transparent in the visible spectrum and has less than 0.01 ohm-cm electrical resistivity.

11. A method for depositing doped zinc oxide upon a substrate, the method comprising:
preparing a composition comprising diethyl zinc, at least one inert carrier, carbon dioxide and a dopant comprising at least one member selected from the group consisting of boron and fluorine wherein the composition is substantially free of water and has ratio of carbon dioxide to diethyl zinc of at least about 8.0,
introducing the composition into a deposition chamber,
exposing the composition to a PECVD environment within the deposition chamber for a time and under conditions sufficient to cause carbon dioxide to function as an oxidant; and
depositing doped zinc oxide upon the substrate wherein the doped zinc oxide is at least about 80% transparent in the visible spectrum and has a resistivity of less than about 0.004 ohm-cm.

12. The method of claim 11 wherein the substrate comprises a polymeric material.

13. The method of claim 11 wherein the doped zinc oxide has a resistivity of less than about 0.001 ohm-cm.

14. The method of claim 11 wherein the doped zinc oxide has a resistivity of less than about 0.0008 ohm-cm.

15. The method of claim 11 wherein the substrate temperature is less than about 350 C.

16. The method of claim 15 wherein the substrate temperature is less than about 200 C.

17. A method for depositing doped zinc oxide upon a substrate, the method comprising:
providing a composition comprising diethyl zinc, at least one diluent, carbon dioxide and at least one boron or fluorine dopant wherein the composition is substantially free of water and $O_2$ and substantially non-reactive under ambient conditions and the ratio of carbon dioxide to diethyl zinc is at least about 8.0,
introducing the composition into a deposition chamber, and;
exposing the composition to a PECVD environment within the deposition chamber at a temperature of less than about 300° C. for a time and under conditions sufficient to cause carbon dioxide to function as an oxidant and to deposit doped zinc oxide upon a substrate comprising at least one member selected from the group consisting of polyproplylene, polycarbonate, polyethylene terepthalate, polyethersulfone and polyamide and wherein the doped zinc oxide is at least about 80% transparent in the visible spectrum and has less than 0.01 ohm-cm electrical resistivity.

18. The method of claim 17 wherein the dopant comprises a boron dopant, the ratio of carbon dioxide to diethyl zinc is at least about 12, the temperature is less than about 200 C and the electrical resistivity is less than 0.0018 ohm-cm.

19. The method of claim 17 wherein the dopant comprises a fluorine dopant, the ratio of carbon dioxide to diethyl zinc is at least about 12, the temperature is less than about 225 C and the electrical resistivity is less than about 0.004 ohm-cm.

20. A method for depositing a film comprising doped zinc oxide upon a substrate, the method comprising:
combining diethyl zinc, at least one diluent, carbon dioxide and at least one boron or fluorine dopant to form a composition wherein the composition is substantially non-reactive under ambient conditions and the ratio of carbon dioxide to diethyl zinc is at least about 8,
introducing the composition into a deposition chamber, and;
establishing a PECVD environment within the deposition chamber at a temperature of less than about 200° C. and a pressure less than about 1 millitorr for a time and under conditions sufficient to cause carbon dioxide to function as an oxidant and to deposit a film comprising doped zinc oxide upon the substrate wherein the film has a resistivity of less than about 0.01 ohm-cm.

21. A method for depositing a film comprising doped zinc oxide upon a substrate, the method comprising:
combining diethyl zinc, at least one diluent, carbon dioxide and at least one boron or fluorine dopant to form a composition,
introducing the composition into a deposition chamber, and;
establishing a PECVD environment within the deposition chamber under conditions sufficient to cause carbon dioxide to function as an oxidant and to deposit a film comprising doped zinc oxide upon the substrate.

22. The method of claim 21 wherein the dopant comprises fluorine.

23. The method of claim 22 wherein the dopant comprises nitrogen trifluoride.

24. The method of claim 21 wherein the dopant comprises boron.

25. The method of claim 24 wherein the dopant comprises triethyl boron.

* * * * *

UNITED STATES PATENT AND TRADEMARK OFFICE
CERTIFICATE OF CORRECTION

PATENT NO. : 8,197,914 B2
APPLICATION NO. : 11/284193
DATED : June 12, 2012
INVENTOR(S) : Diwakar Garg et al.

It is certified that error appears in the above-identified patent and that said Letters Patent is hereby corrected as shown below:

Column 13, Line 22

Delete "350 C." and insert -- 350° C.--

Column 13, Line 24

Delete "200 C." and insert -- 200° C.--

Column 13, Line 67

Delete "350 C." and insert -- 350° C.--

Column 14, Line 2

Delete "200 C." and insert -- 200° C.--

Column 14, Line 25

Delete "200 C" and insert -- 200° C--

Column 14, Line 29

Delete "225 C" and insert -- 225° C--

Signed and Sealed this
Ninth Day of April, 2013

Teresa Stanek Rea
*Acting Director of the United States Patent and Trademark Office*